United States Patent [19]
Conrad

[11] 4,395,084
[45] Jul. 26, 1983

[54] ELECTRICAL SOCKET FOR LEADLESS INTEGRATED CIRCUIT PACKAGES

[75] Inventor: Richard A. Conrad, Vista, Calif.

[73] Assignee: Teledyne Industries, Inc., Los Angeles, Calif.

[21] Appl. No.: 280,324

[22] Filed: Jul. 6, 1981

[51] Int. Cl.³ ............................................. H01R 23/72
[52] U.S. Cl. .................... 339/75 MP; 29/884; 339/17 CF; 339/176 MP
[58] Field of Search ............ 339/17 CF, 75 R, 75 M, 339/75 MP, 176 M, 176 MP; 29/883, 884; 174/52 FP

[56] References Cited

U.S. PATENT DOCUMENTS

| | | | |
|---|---|---|---|
| 3,026,494 | 3/1962 | Andersen et al. | 339/17 CF |
| 3,877,064 | 4/1975 | Scheingold et al. | 339/17 CF |
| 3,904,262 | 9/1975 | Cutchaw | 339/75 MP |
| 3,940,786 | 2/1976 | Scheingold et al. | 339/17 CF |
| 3,951,491 | 4/1976 | Mysiak | 339/176 MP |
| 3,982,159 | 9/1976 | Dennis et al. | 339/17 CF |
| 4,008,938 | 2/1977 | Anhalt et al. | 339/17 CF |
| 4,063,791 | 12/1977 | Cutchaw | 339/17 CF |
| 4,340,266 | 7/1982 | Grovender | 339/17 CF |

FOREIGN PATENT DOCUMENTS

| | | | |
|---|---|---|---|
| 993970 | 7/1976 | Canada | 339/17 CF |
| 1004263 | 9/1965 | United Kingdom | 29/884 |
| 2008333 | 5/1979 | United Kingdom | 339/17 CF |

Primary Examiner—John McQuade
Attorney, Agent, or Firm—Reagin & King

[57] ABSTRACT

A frame type electrical socket for connecting leadless integrated circuit packages to a printed circuit board is disclosed. The socket includes a rectangular frame member and four contact assemblies. Each contact assembly is designed to detachably mate with each side of the frame. The contact assemblies include molded-in-place contacts which are shaped to provide pressure contacts after they are molded in place. Prior to molding, the contacts are in the form of flat ribbons, allowing them to be constructed in the form of a lead frame. The socket possesses all of the features of molded-in-place contacts as well as having the advantage of being able to replace damaged contacts without discarding the frame.

7 Claims, 15 Drawing Figures

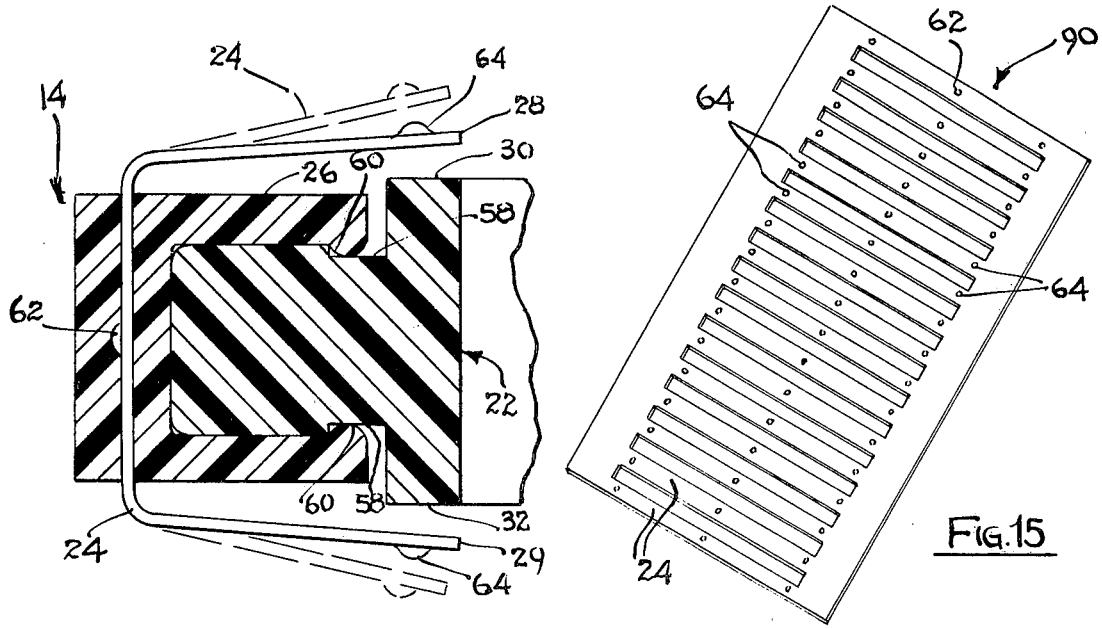
FIG. 7
FIG. 15
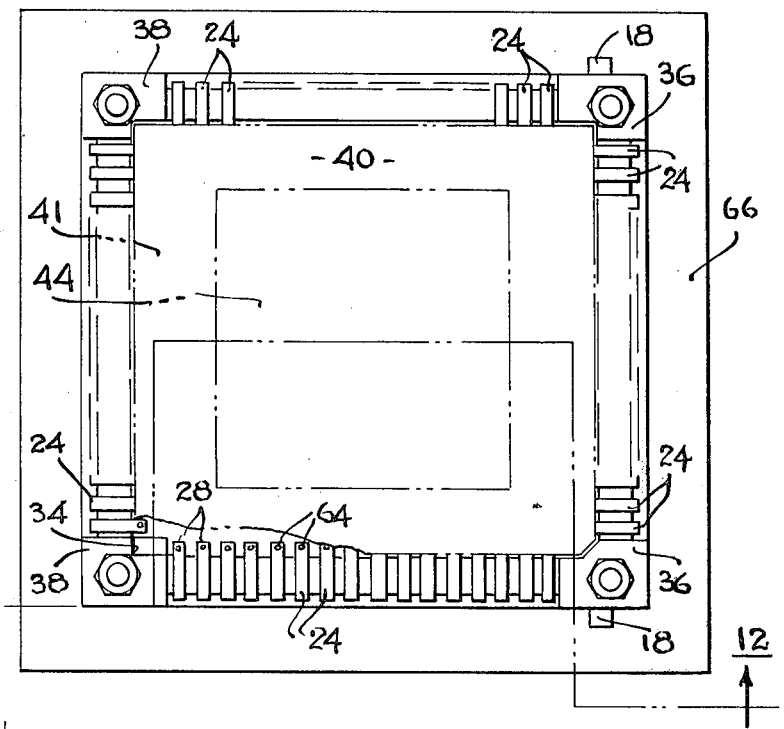
FIG. 8
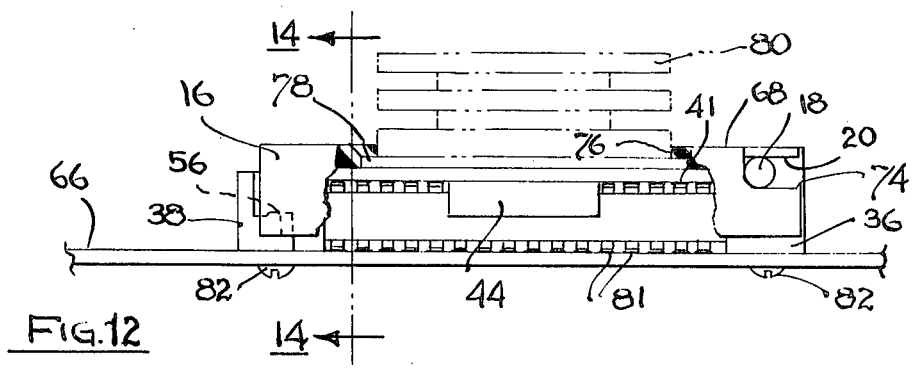
FIG. 12

ELECTRICAL SOCKET FOR LEADLESS INTEGRATED CIRCUIT PACKAGES

BACKGROUND OF THE INVENTION

This invention relates to electrical sockets, and more particularly to a frame type electrical socket for connecting leadless integrated circuit packages to a printed circuit board.

There is an electronic component known as a leadless integrated circuit package which is used to house large scale integrated circuit devices. This type of package is typically in the form of a thin rectangular substrate having a plurality of conductive areas or pads which are spaced along the edges of the substrate. Many prior art electrical sockets have been devised for electrically connecting this type of package to a printed circuit board.

The socket of the class to which this invention relates employs a base in the form of a frame which has a cavity in the top surface thereof designed to receive the leadless integrated circuit package. A plurality of pressure type electrical contacts is mounted along the periphery of the cavity. The leadless integrated circuit package is mounted within the cavity with the conductive pads of the package facing the pressure contacts. A cover is then placed over the integrated circuit package and fastened to the frame. The cover provides pressure on the backside of the integrated circuit package, causing the conductive pads to compress the pressure contacts and to form a gas tight contact. The pressure contacts mounted within the frame are designed so that one end of each of these contacts projects below the bottom surface of the frame, forming a second set of pressure contacts which may be used to mate with conductive pads on a printed circuit board. Thus, by fastening the frame to a printed circuit board, electrical contact is established between the conductive pads on the integrated circuit package and the conductive pads on the printed circuit board.

Some of the prior art sockets described above are designed so that the individual contacts are inserted into the frame after the frame has been formed by means such as molding. As shown in Scheingold et al U.S. Pat. Nos. 3,877,064 and 3,940,786, issued Apr. 8, 1975 and Feb. 24, 1976, respectively, this type of socket design requires the frame to be fabricated with means for retaining the individual contacts after they are inserted. The contacts themselves must be formed into an intricate shape such as the S pattern shown in the Scheingold references to both provide the required pressure contact and to engage the retaining means in the frame. The contacts must also be properly oriented before they are inserted into the frame.

Generally, frame type sockets employing insertable contacts are larger and more difficult and costly to assemble than those sockets employing molded-in contacts. In addition, insertable contacts do not possess the strength or ruggedness of molded-in contacts. One advantage, however, of insertable contacts is that a damaged contact may be replaced without the need for discarding the entire frame.

Other prior art sockets of the class to which this invention relates employ contacts which are molded into place along the periphery of the frame at the same time that the frame is formed. This type of construction, known as insert molding, requires that each contact be preformed prior to assembly to form a pressure contact. Such preforming generally necessitates that the contacts be handled one at a time and be carefully inserted into a mold in the proper orientation. This method of assembly is extremely time consuming and expensive. Further, if a contact should become damaged, the entire socket including the frame must be discarded since there are no means for replacing damaged contacts. An example of this type of socket is shown in Cutchaw U.S. Pat. No. 4,063,791, issued Dec. 20, 1977. Cutchaw shows pressure type contacts which are formed into a generally U-shape at either end to provide a pressure contact.

Accordingly, it is an object of the present invention to provide a new and improved electrical socket for leadless integrated circuit packages.

It is another object of the present invention to provide a socket having molded-in contacts and where the contacts may be formed to provide a pressure contact after they are molded in place.

It is a further object of the present invention to provide a socket having molded-in contacts and where damaged contacts may be replaced without discarding the frame portion of the socket.

SUMMARY OF THE INVENTION

The foregoing and other objects of the invention are accomplished by a socket which includes a generally rectangular shaped frame member having a recess in its top surface designed to receive the substrate of a leadless integrated circuit package. All four sides of the frame member are formed to have a generally T-shaped cross section where the center leg of the T is horizontally disposed and extends outwardly from the center of the frame.

The socket of the present invention also includes four contact assemblies each having a generally C-shaped cross section which is designed to fit over and mate with the center leg of the T-shaped side of the frame. A series of flat, parallel, spaced apart, resilient, electrically conductive contacts are molded within and parallel to the base portion of the C-shaped contact assembly. After the contacts are molded in place, the opposite ends of each of the contacts are bent so that the ends of the contacts lie adjacent the outside surface of the sides of the C-shaped assembly.

The socket is assembled by snapping a contact assembly onto a projecting leg on each of the sides of the frame. When a contact assembly has been assembled to each of the four sides of the frame in the manner described above, one end of each of the contacts projects upwardly in a spaced apart arrangement along the periphery of the recess in the top surface of the frame designed to hold the leadless integrated circuit package. Bending the contacts after they are molded in place in the contact assembly provides a cantilever spring action in the ends of the contacts. When the substrate of the leadless integrated circuit package is placed onto the frame, each of the connective pads on the substrate contacts an end of one of the resilient contacts.

One end of each of the resilient contacts also projects below the bottom surface of the frame and is designed to resiliently contact a conductive pad on a printed circuit board to which the socket is mounted. Due to the symmetrical form of the contacts within the socket of the present invention, the pattern of the conductive pads on the printed circuit board is identical to the pattern of the conductive pads of the substrate of the leadless integrated circuit package.

The socket is designed to be mounted to the printed circuit board by means of four screws and nuts. A clearance hole is provided in each of the corners of the frame so that screws may be inserted through these clearance holes and through four corresponding holes in the printed circuit board. When the socket is fastened in place on the printed circuit board, the cantilevered spring-action of the resilient contacts provides a downward force ensuring positive connection to the pads on the printed circuit board.

A cover is also provided for the socket of the present invention to retain the leadless integrated circuit package in place and to apply pressure to the package. The cover exerts a spring force on each of the contact ends and ensures positive connection to the pads on the package.

If necessary, each of the four contact assemblies may be easily detached from the frame by means of a suitable tool. Thus, should a contact become damaged, that particular contact assembly may be easily replaced without having to replace either the frame or any of the other contact assemblies. Additionally, the fact that the contacts may be molded while they are flat permits the contacts to be molded into place while they are in the form of a lead frame. The lead frame allows a plurality of contacts to be handled as a single component which greatly simplifies the molding and assembly of the socket of the present invention.

Other obvious features and advantages of the invention will become apparent from the reading of a specification when taken in conjunction with the drawings in which like reference numerals refer to like elements in the several views.

BRIEF DESCRIPTION OF THE DRAWINGS

FIG. 7 is a detail cross-sectional view of the contact assembly mated to the frame member showing the means for retaining the contact assembly to the frame member;

FIG. 8 is a top view, partially cut away, showing the assembled socket of the present invention with the cover removed for clarity;

FIG. 12 is a cross-sectional view of the assembled socket taken along section 12—12 of FIG. 8 and showing an optional heatsink which may be used with the socket;

FIG. 15 is a perspective view of a lead frame which may be used to support a plurality of contacts when they are molded into the contact assemblies of the socket of the present invention.

DESCRIPTION OF THE PREFERRED EMBODIMENT

Figure 1:
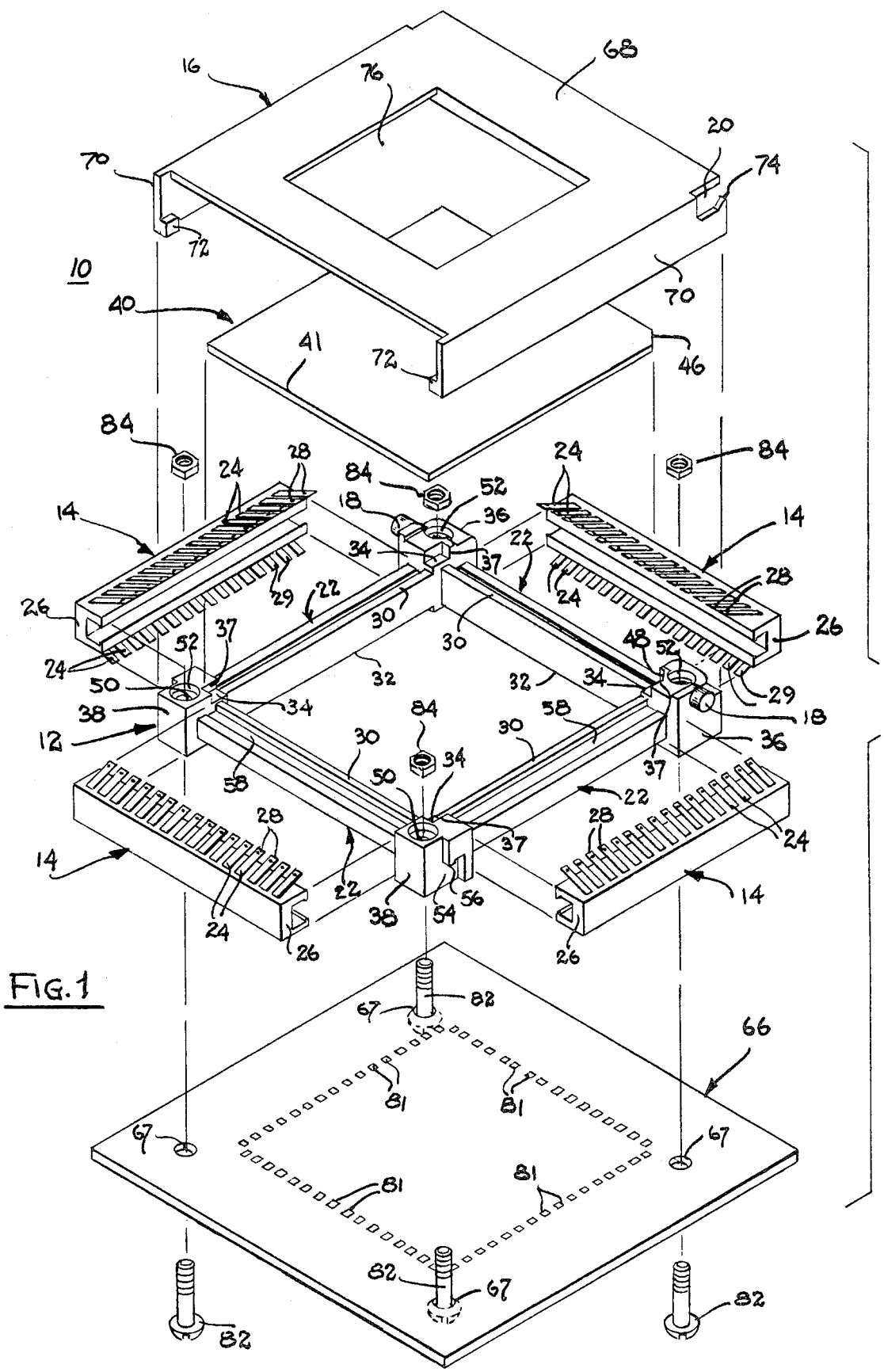
FIG. 1 is an exploded perspective view showing the assembly of an electrical socket make according to the present invention.

Referring to FIG. 1, there is shown a perspective view of the socket of the present invention illustrating the method of assembly. The socket 10 inclues a generally rectangular shaped frame member 12 to which are attached four generally C-shaped contact assemblies 14. A cover 16 is also provided which is rotatably mounted to the frame 12 by engaging cylindrical bosses 18 of the frame 12 with slots 20 provided in the cover 16. The generally C-shaped contact assemblies 14 are designed to fit over and mate with the generally T-shaped side walls 22 of the frame 12. Mounted within the contact assemblies 14 are a plurality of parallel, spaced-apart, resilient, electrically conductive contacts 24. The contacts 24 are molded within and parallel to the vertical sides of a C-shaped contact support 26. The opposite ends of the contacts 24, which project from the support 26, are bent so that the contacts 24 also assume a generally C-shaped form. As shown in FIG. 1, the free ends 28 and 29 of the contacts 24 straddle and project beyond the horizontal sides of the support 26.

The generally T-shaped sides 22 of the frame 12 form upper and lower ridges 30 and 32 around the periphery of the upper and lower surfaces, respectively, of the frame 12. When the contact assemblies 14 are assembled to the frame 12, the free ends 28 and 29 of the contacts 24 are positioned, respectively, above and below the ridges 30 and 32. Corner steps 34 are also provided, which project above the surface of the ridge 30 in each of the corners of the frame 12. Each of the steps 34 is formed as part of a corner recess 37 in each of corner posts 36 and 38 of the frame 12.

Figure 2:
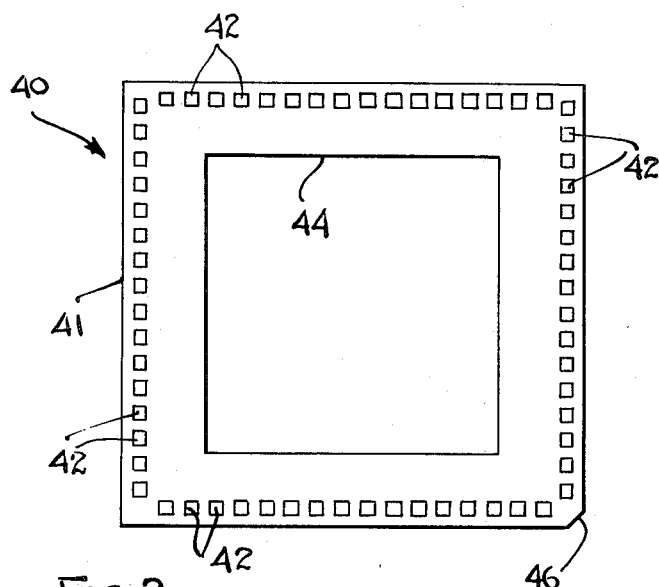
FIG. 2 is a top view of a leadless integrated circuit package which may be used with the socket of the present invention.

Referring to FIG. 2, there is shown a top view of a leadless integrated circuit package 40 to be used with the socket 10 of the present invention. The package 40 is generally in the form of a thin rectangular substrate 41 having a plurality of spaced apart electrically conductive pads 42 positioned around the periphery of the package 40. The conductive pads 42 are in turn connected to a large scale integrated circuit mounted in the central portion of the substrate and surrounded by a protective cover 44. One corner of the substrate 41 is provided with a chamfer 46 which acts as an orientation key for the package 40.

Prior to the insertion of the package 40 into the frame 12, socket 10 is mounted to a printed circuit board 66 as shown in FIG. 1, by means of screws 82 which pass through clearance holes 67 in the printed circuit board and through clearance holes 50 provided in the corner posts 36 and 38 of the socket 10. Hexagonally shaped recesses 52 are also provided within the corner posts 36 and 38 to retain nuts 84 through which the mounting screws may be threaded. The printed circuit board 66 is provided with a plurality of conductive pads 81 having the same layout as the conductive pads 42 on the substrate 41 as shown in FIG. 2. When the socket 10 is fastened to the printed circuit board 66 the free ends 29 of the contacts 24 provide a pressure contact to each of the corresponding pads 81 on the printed circuit board.

After the socket 10 is mounted to the circuit board 66, the package 40 is inserted into the socket 10 by placing the corners of the substrate 41 into the corner recesses 37 of the socket 10 as shown in FIG. 1. A chamfer 48 is provided in one of the recesses 37 of the socket 10 and provides an orientation key in conjunction with the chamfer 46 of the package 40. When the package 40 is placed as thus described within the frame 12, each of the conductive pads 42 on the substrate 41 is in contact with one of the free ends 28 of the resilient contacts 24 of the socket 10.

The cover 16 of the socket 10, which is rotatably mounted to the cylindrical bosses 18, is now pressed down onto the back surface of the substrate 41. As described above, the shape of the contacts 24 provides a cantilevered spring-action to the free ends 28. Depressing the cover 16 onto the substrate 41 creates a pressure contact between the ends 28 and the conductive pads 42. The cover 16 is retained in place by means of ears (not shown in FIG. 1) on the cover 16 which mateably engage with recesses 54 provided in the corner posts 38 of the frame 12.

The socket 10 as thus described provides electrical connection between each of the conductive pads 42 of the package 40 and the corresponding conductive pads 81 on the printed circuit board 66 to which the socket 10 is mounted.

Figure 5:
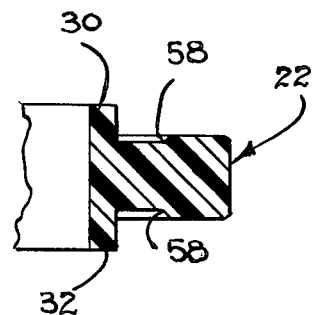
FIG. 5 is an enlarged cross-sectional view of the frame member taken along 5—5 of FIG. 3 which is symmetrical for each side.
Figure 3:
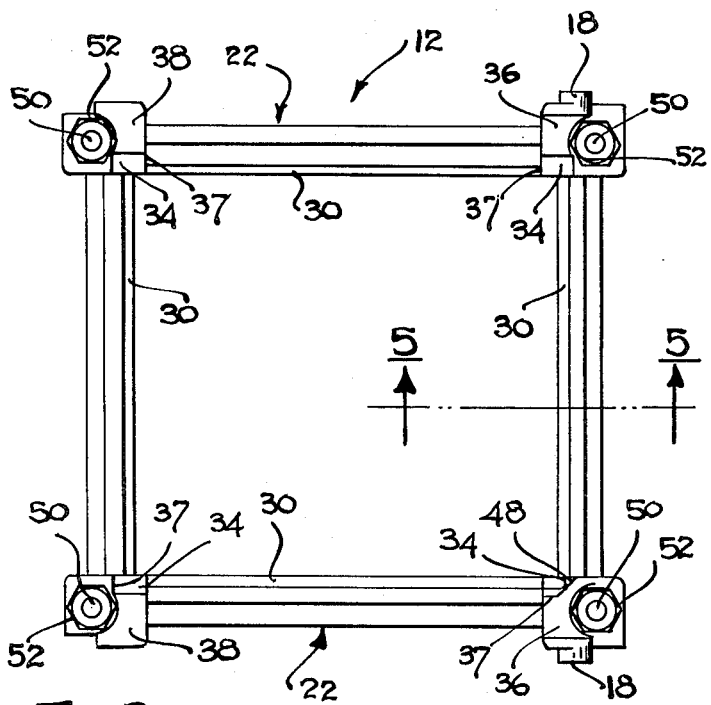
FIG. 3 is a top view of the frame member of the socket of the present invention.
Figure 4:
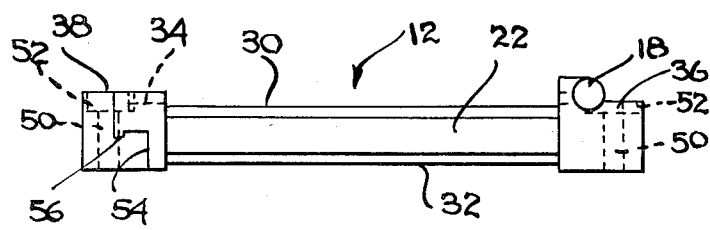
FIG. 4 is a side view of the frame member shown in FIG. 3.

Referring to FIGS. 3 and 4, there are shown top and side views respectively of the frame 12 of the socket 10, which may be constructed of a moldable thermoplastic such as Valox 420-SEO. FIG. 4 shows the details of the recesses 54 provided in each of the corner posts 38 and used to retain the cover 16 in a closed position. A projection 56 is provided at the outer edge of the recess 54 to aide in the retention of the cover 16 as described below. The generally T-shaped form of the sides 22 of the frame 12 are shown in FIG. 5 which is a cross-sectional view taken along any of the lines 5—5 of FIG. 3. As can be seen in FIG. 5, recesses 58 are provided along the length of the sides 22 and in that portion projecting outwardly from the frame 12 designed to mate with the contact assemblies 14. The recesses 58 provide means for retaining the contact assemblies 14 after they are assembled to the frame 12.

Figure 6:
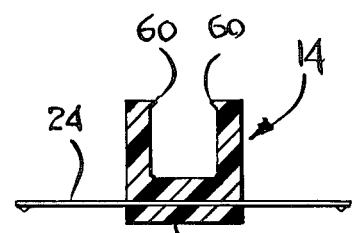
FIG. 6 is a cross-sectional view of the contact assembly of the socket of the present invention showing the position of the contacts prior to bending.

FIG. 6 shows a cross-sectional detail of a contact assembly 14. Projections 60 are provided which are inwardly disposed along both sides of the generally C-shaped support 26. The projections 60 are designed to mate with the recesses 58 of the sides 22 to provide retention means for the assemblies 14. FIG. 6 also shows the position of the contacts 24 which are molded within the supports 26 and which are in the shape of flat ribbons prior to bending.

FIG. 7 shows the relative position of the contact assembly 14 when mated to the side 22 of the frame 12. The top and bottom sides of the support 26 are formed in relatively thin sections and of a resilient plastic material such as Valox 420-SEO. Thus when the support 26 is pressed onto the projecting leg of the side 22 the top and bottom sections of the support 26 expand outwardly, slide over the projecting leg of the side 22, and finally snap together so that the projections 60 on the support 26 engage with the recesses 58 provided in the side 22. Thus, the contact assemblies 14 may be snapped together and retained in place on the sides 22 of the frame 12. In like manner, the contact assembly 14 may be disassembled from the frame 12 by use of a suitable tool, such as a screwdriver, to pry the contact assembly 14 free from the side 22. It can also be seen from FIG. 7 that the portion of the contact 24 molded within the support 26 is provided with an upset 62 which aides in retaining the contact 24 in place within the plastic support 26. Accordingly, the socket 10 has all of the advantages of molded-in contacts, such as strength and ruggedness, as well as having the advantage of insertable contacts; namely, the ability to replace damaged contacts.

As shown in FIG. 7, the free ends 28 and 29 of the contacts 24 are upset to form contact points 64. The contact points 64 are relatively sharp and assist in making conductive contact to the pads 42 of the leadless package 40 as well as to the conductive pads 81 of the printed circuit board 66 to which the socket 10 is mounted.

After the contacts 24 are embedded within the support 26 by means such as insert molding, the contacts 24 are bent from the flat position shown in FIG. 6 to the generally C-shaped position as shown by the dotted lines in FIG. 7. Forming the contacts 24 in this manner creates a cantilevered spring-action at the free ends 28 and 29. When the socket 10 is fully assembled with the leadless package 40 and mounted to the printed circuit 66 the free ends 28 and 29 of the contacts 24 assume the positions shown by the solid lines in FIG. 7. The deformation of the free ends 28 and 29 assures a high pressure contact to both the leadless package 40 and the printed circuit board 66.

Figures 9, 11:
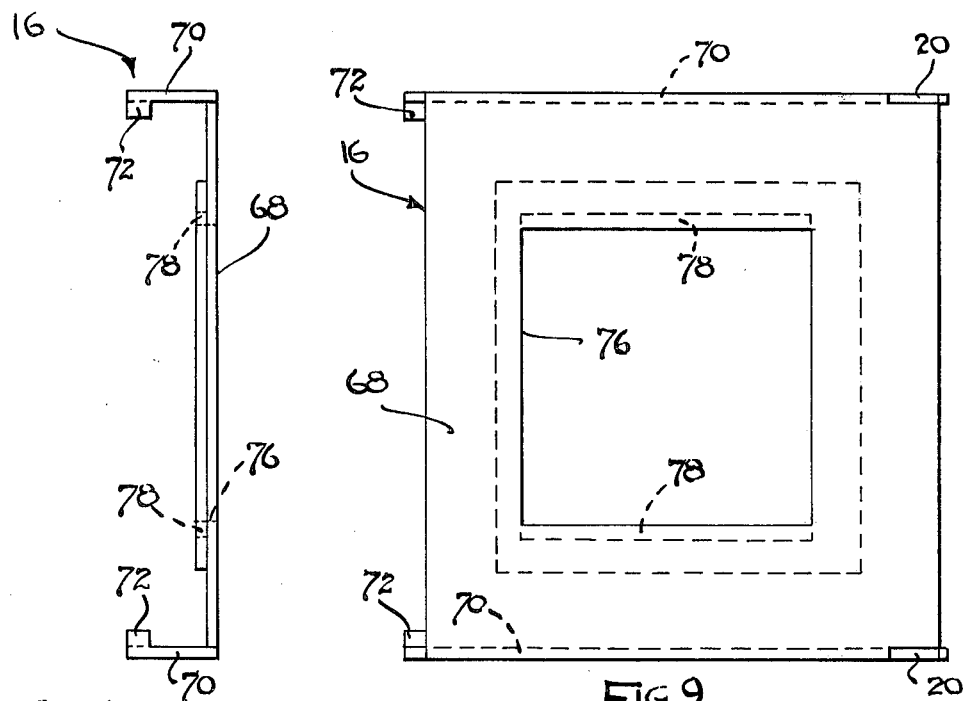
FIG. 9 is a top view of a cover used with the socket of the present invention.
FIG. 11 is a left side view of the cover shown in FIG. 9.
Figure 10:
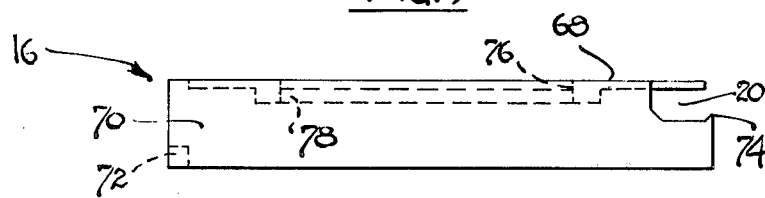
FIG. 10 is a front view of the cover shown in FIG. 9.

FIG. 8 is a top view, partially cut away, of the assembled socket 10 with the leadless package 40 in place. The cover 16 has been removed for clarity and the socket 10 is shown mounted to the circuit board 66. The details of the cover 16 are shown separately in FIGS. 9, 10 and 11 which are, respectively, the top, front, and side views of the cover 16. The cover 16, which may be formed of the same material as the frame, has a generally C-shaped form including a flat top 68 and two relatively thin sides 70. At one end of the cover 16, two inwardly projecting ears 72 are provided at the lower extremities of the ends 70. At the opposite end of the cover 16, two slots 20 are provided in the sides 70. As described above, the slots 20 are designed to rotatably engage the cylindrical bosses 18 affixed to the corner posts 36 of the frame 12. A small inwardly disposed projection 74 is provided on one side of the opening of each of the slots 20 of the cover 16. The projections 74 provide retention means for the cover as described below.

One embodiment of the cover 16 includes a clearance aperture 76 in the top 68 of the cover 16 for mounting a heatsink as described below. Recesses 78 are provided around the periphery of the aperture 76 and on the underside of the top 68, and are used to retain the heatsink.

FIG. 12 is a partial cross-sectional view taken along the line 12—12 of FIG. 8 and shows the position of the cover 16 and an optional heatsink 80 which may be used with the socket 10 of the present invention. As shown in FIG. 12, the cover 16 is rotatably mounted to the frame 12 by engaging the slots 20 with the circular bosses 18. The projection 74 provides a snap fit and means for retaining the cover 16 to the frame 12. When the cover 16 is fastened in place it presses on the back surface of the substrate 41 of the package 40. Heatsinking of the integrated circuit, which is mounted on the substrate 41 within the protective cover 44, may be achieved by combining heatsink 80 with the cover 16. As shown in FIG. 12, the heatsink 80, which may be formed of aluminum or other suitable material, is inserted through the clearance hole 76 provided in the top 68 of the cover 16. The bottom surface of the heatsink 80 is flanged in a manner which retains the heatsink 80 within the recesses 78 in the cover 16. When the cover 16 is closed, the bottom surface of the heatsink 80 is brought into pressure contact with the rear surface of the substrate 41 and provides a means for cooling the integrated circuit within the package 40.

Figure 13:
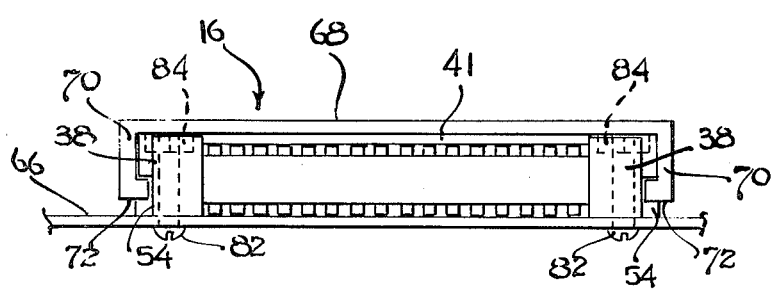
FIG. 13 is a left side view of the electrical socket shown in FIG. 8 illustrating the means for retaining the cover.

The means for retaining the cover 16 in the closed position is best shown in FIG. 13. By virtue of the elongated slots 20, the cover 16 can be slid out so that the ears 72 extend beyond and clear the posts 38 when the cover 16 is rotated down against the substrate 41. Sliding the cover 16 back towards the posts 36 causes the ears 72 to engage with the recesses 54 provided in the corner posts 38, thus, locking the cover 16 to the corner posts 38. The pressure of the contacts 24 against the substrate 41 and thus against the cover 16 holds the ears 72 within the recesses 54. As shown in FIG. 12, the projection 56 at the outer edge of the recess 54 provide additional retention means for the cover 16.

FIGS. 12 and 13 also show the positions of the screws 82 and nuts 84 which may be used to mount the socket 10 to a printed circuit board 66. The screws 82 project up through clearance holes 67 in the printed circuit board 66 and through the clearance holes 50 provided in the frame 12. The hexagonal recesses 52 provide means for capturing the nuts 84, and they also permit the nuts 84 to be recessed below the top surface of the corner posts 36 and 38. This provides clearance for the cover 16 in the closed position. It should be noted that the means for mounting and retaining the cover 16 to the frame 12 does not require any additional components since both the mounting and retaining means are formed as an integral part of the cover 16 and the frame 12. Accordingly, a complete socket 10 requires only six parts: the frame 12, the cover 16, and the four contact assemblies 14.

Figure 14:
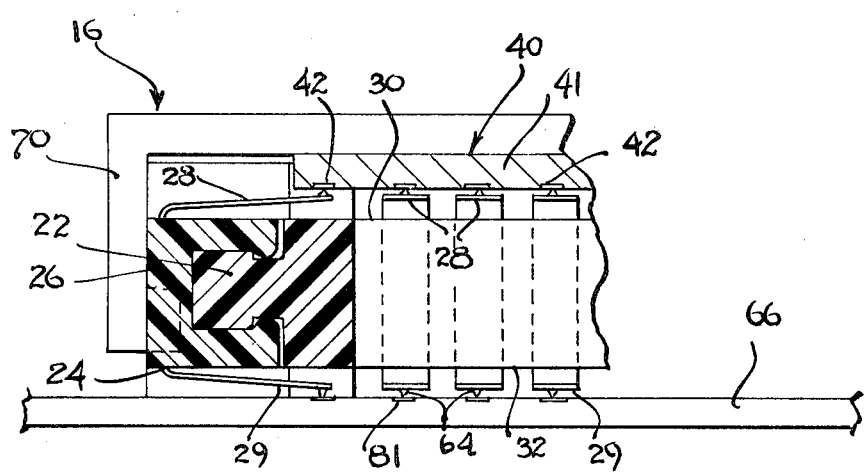
FIG. 14 is another cross-sectional view of the assembled socket taken along section 14—14 of FIG. 12.

The position of the free ends 28 and 29 of the contacts 24, in the fully assembled socket 10, are shown in FIG. 14, which is a partial cross-sectional view taken along lines 14—14 of FIG. 12. FIG. 14 shows how the cantilevered spring action of the formed contacts 24 provide a pressure contact to both the package 40 and the printed circuit board 66.

FIG. 15 shows a perspective view of a lead frame 90 used to support a plurality of contacts 24, when they are being molded into the supports 26 to form the contact assemblies 14. The lead frame 90 is a thin flat sheet or stip of contact material, such as a cooper alloy, in which ribbon shaped contacts 24 are formed by stamping or selectively chemically etching the frame 90. Such means for forming contacts are well known to those skilled in the art. Because the contacts 24 are unbent prior to molding, the lead frame may be used to support a plurality of the contacts 24 during the molding operation. This method, in which all of the contacts are handled as a single component, greatly simplifies the molding and assembly of the socket 10.

In addition, it is possible to form the lead frame 90 into a long strip having all of the required number of contacts 24 for one or more sockets 10, and to mold these contacts 24 into a long bar having the form of the support 26. The resulting assembly can then be cut apart after molding to form the individual assemblies 14. For example, if the socket 10 requires sixteen contacts 24 on each side, a lead frame strip having sixty-four contacts can be molded into one long assembly. After molding, the assembly is cut into four equal lengths, each representing the desired assembly 14. The upsets 62 and contact points 64 may also be formed at the same time that lead frame 90 is stamped to form the contacts 24.

While there has been shown and described the preferred embodiment of the frame type electrical socket of the present invention, it is to be understood that various other adaptations and modifications may be made within the spirit and scope of the invention. It is thus intended that the invention be limited in scope only by the appended claims.

What is claimed is:

1. A socket for making electrical connections to leadless integrated circuit packages comprising:
    a frame having elongated, generally T-shaped sides where the center leg of each T is horizontally disposed and extends outwardly from the center of the frame;
    contact assemblies, each corresponding to a respective side of the frame, where each assembly includes an elongated, generally C-shaped support having a vertical side, two resilient horizontal sides and an open end, and a plurality of parallel, spaced-apart, resilient, electrically conductive contacts embedded within, parallel to, and along the length of the vertical side of the C-shaped support; and
    means for detachably mating the contact assemblies to the frame.

2. The socket of claim 1 in which the means for detachably mating the contact assemblies to the frame includes, for each assembly:
    projections depending inwardly from each of the horizontal sides of the support; and
    recesses horizontally disposed along the length of and on both sides of the center leg of each T-shaped side of the frame, whereby when the resilient horizontal sides of the C-shaped support are placed over the center leg of the corresponding T-shaped side of the frame, the projections on the C-shaped support engage in the recesses in the T-shaped side of the frame.

3. The socket of claim 1 in which the contacts are shaped to form cantilevered springs after the contacts are embedded in the support.

4. The socket of claim 3 in which the contacts are shaped so that the ends of the contacts extend toward the open end of the C-shaped support.

5. A method of assembling an electrical socket for leadless integrated circuit packages, comprising the steps of:
    forming a frame having elongated, generally T-shaped sides where the center leg of the T is horizontally disposed and extends outwardly from the center of the frame, the center leg also having recesses horizontally disposed along the length of and on both sides of the center leg;
    forming a plurality of resilient electrically conductive contacts;
    forming a contact assembly for each side of the frame, including embedding the plurality of contacts within an elongated, generally C-shaped support having a vertical side, two resilient horizontal sides, an open end, and projections depending inwardly from each of the horizontal sides of the support, whereby the contacts are spaced apart parallel to and extend along the length of the vertical side of the C-shaped support;

shaping the contacts to form cantilevered springs; and positioning the horizontal sides of each support over the center leg on the corresponding side of the frame so that the projections on each support engage within the recesses in the corresponding side of the frame.

6. The method of claim 5 in which the step of forming a plurality of contacts includes the step of forming the plurality of contacts as a lead frame; and in which the step of forming a contact assembly includes the step of insert molding the lead frame into the support.

7. The method of claim 5 in which the step of forming the frame includes the steps of forming cylindrical hubs projecting outwardly from two adjacent corners of the frame, and forming cover recesses within the two opposing corners of the frame, and which further includes the steps of:

forming a cover having a flat top, two depending sides, elongated slots formed within the sides at one end of the cover, and ears inwardly projecting from the sides at the other end of the cover;

engaging the slots of the cover with the hubs of the frame;

moving the cover outward so that the ears project beyond and clear the corner recesses;

rotating the cover onto the frame; and moving the cover inward so that the ears on the cover engage within the corner recesses.

* * * * *